United States Patent
Nagasawa

(10) Patent No.: US 11,843,384 B2
(45) Date of Patent: Dec. 12, 2023

(54) NOISE REDUCTION DEVICE

(71) Applicant: Mitsubishi Electric Corporation, Tokyo (JP)

(72) Inventor: Shinobu Nagasawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/794,992

(22) PCT Filed: Mar. 24, 2020

(86) PCT No.: PCT/JP2020/013042
§ 371 (c)(1),
(2) Date: Jul. 25, 2022

(87) PCT Pub. No.: WO2021/192042
PCT Pub. Date: Sep. 30, 2021

(65) Prior Publication Data
US 2022/0376684 A1    Nov. 24, 2022

(51) Int. Cl.
*H03K 5/1252*    (2006.01)
*H03K 5/00*    (2006.01)

(52) U.S. Cl.
CPC . *H03K 5/1252* (2013.01); *H03K 2005/00286* (2013.01)

(58) Field of Classification Search
CPC ....... H03K 5/1252; H03K 2005/00286; H03K 3/013; H03K 17/16; H02J 1/02; G05F 1/10; H02M 1/12; H02M 7/48
See application file for complete search history.

(56) References Cited

U.S. PATENT DOCUMENTS

| | | | |
|---|---|---|---|
| 2001/0045863 A1 | 11/2001 | Pelly | |
| 2008/0180278 A1* | 7/2008 | Denison | A61B 5/7203 340/870.18 |
| 2018/0123543 A1 | 5/2018 | Rambaud et al. | |

FOREIGN PATENT DOCUMENTS

| | | |
|---|---|---|
| JP | 2002-10650 A | 1/2002 |
| JP | 2018-511287 A | 4/2018 |
| WO | 2016/208762 A1 | 12/2016 |

OTHER PUBLICATIONS

International Search Report and Written Opinion dated Jun. 16, 2020, received for PCT Application PCT/JP2020/013042, filed on Mar. 24, 2020, 8 pages including English Translation.
(Continued)

*Primary Examiner* — Jung Kim
(74) *Attorney, Agent, or Firm* — XSENSUS LLP

(57) ABSTRACT

A compensation signal generator generates a compensation signal for canceling an electromagnetic noise on a connection line on the basis of a detection signal of a noise detector. A compensation signal injector injects the compensation signal into the connection line. A compensation signal detector outputs a detection signal of the compensation signal. A low-frequency component subtraction unit amplifies a component in a predetermined first frequency region of the detection signal and negatively feeds back the amplified component to the compensation signal generator. An intermediate frequency component addition unit positively feeds back a component of a predetermined second frequency that is higher than the first frequency region in the detection signal to the compensation signal generator.

7 Claims, 11 Drawing Sheets

(56) References Cited

OTHER PUBLICATIONS

Mollov et al., "A Fully-Isolated Robust Common-Mode Hybrid Filter", CIPS 2018—10th International Conference on Integrated Power Electronics Systems, 2018, pp. 18-24.

* cited by examiner

FIG.6
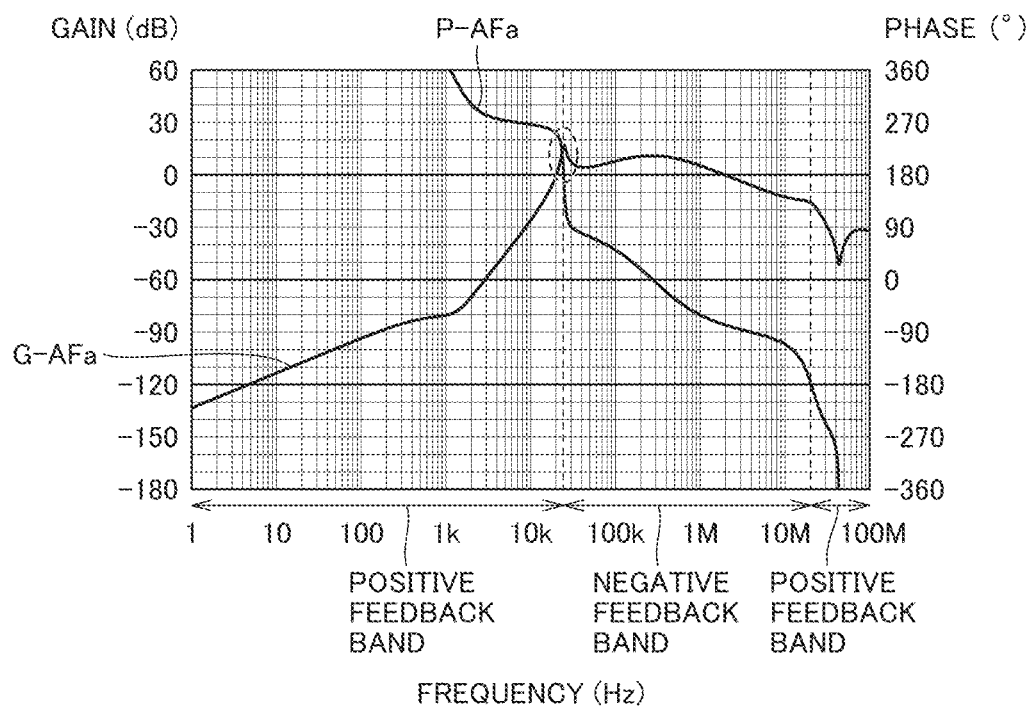
(a)
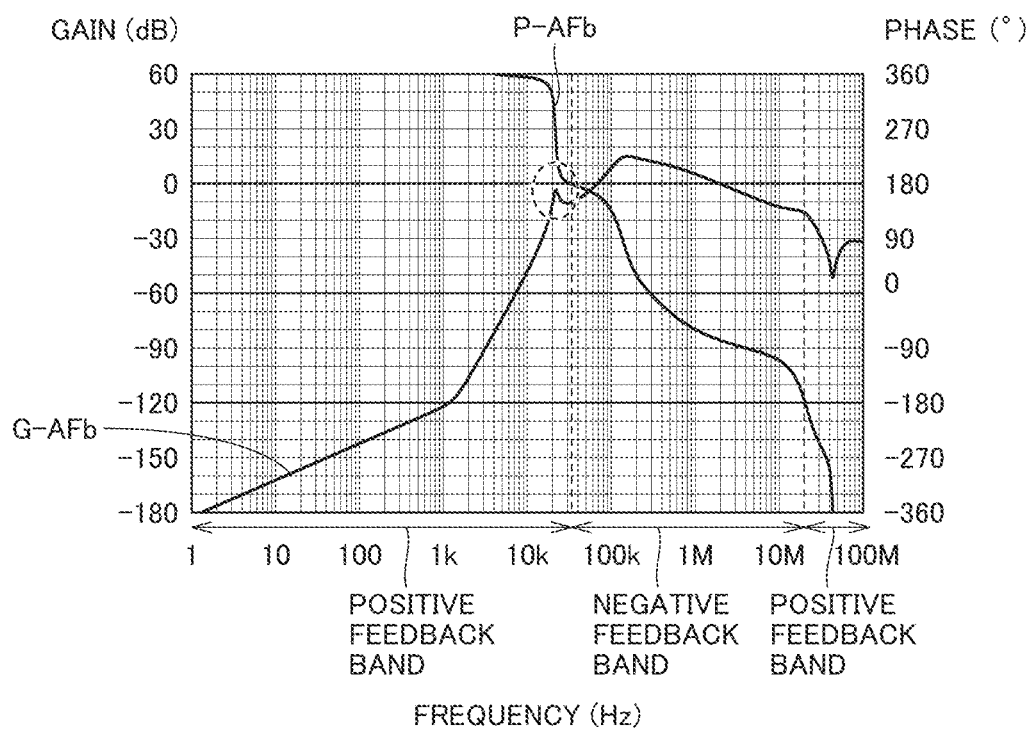
(b)

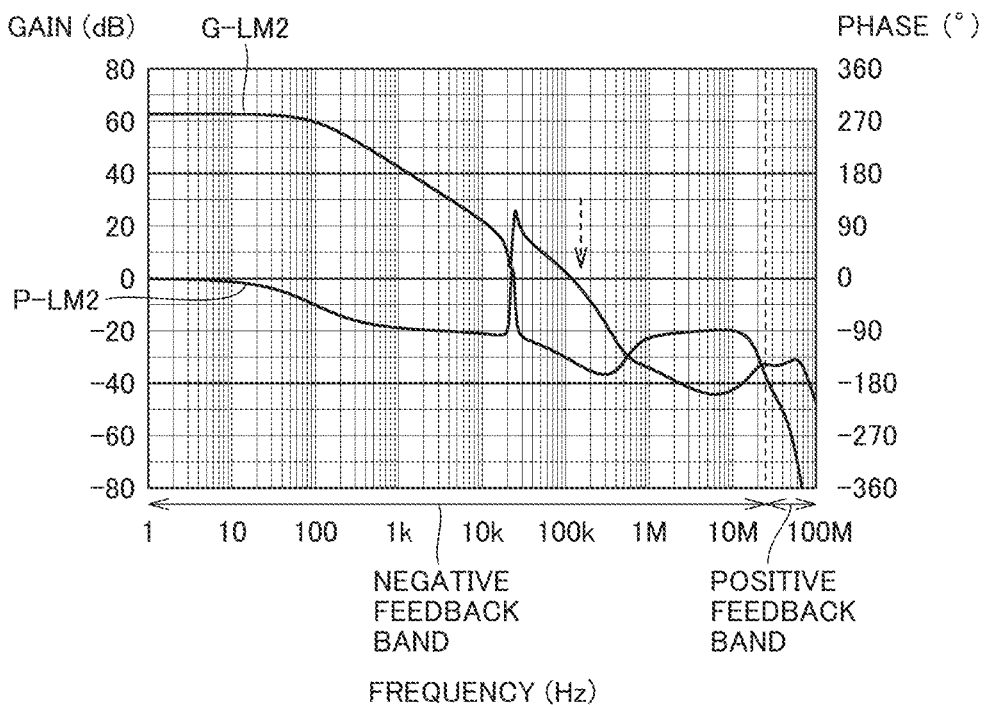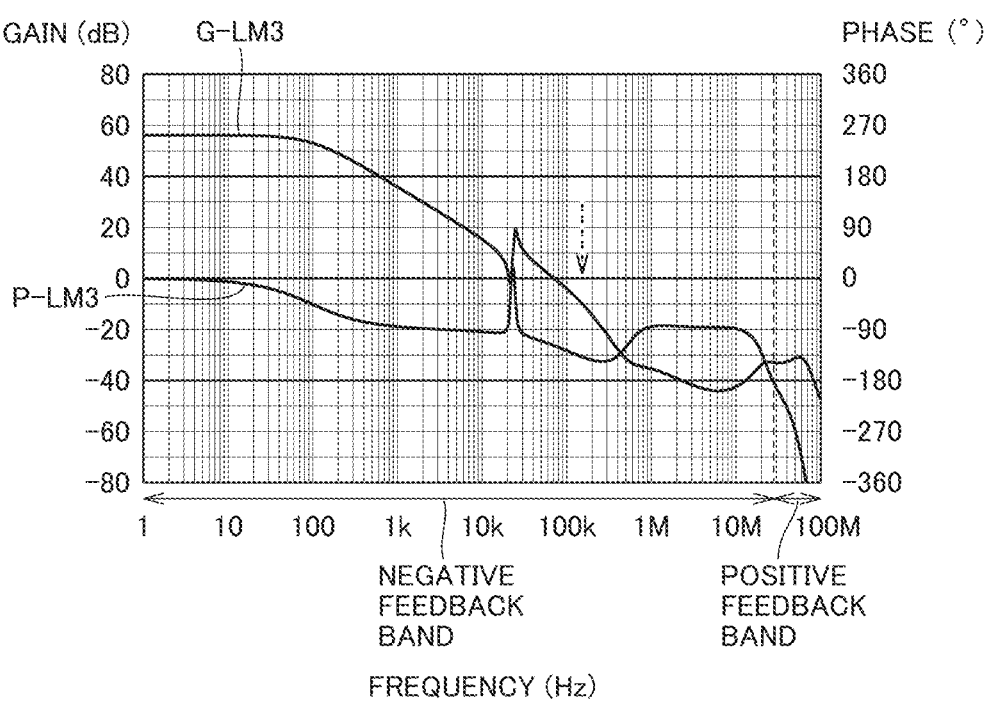

FIG.9
(a)
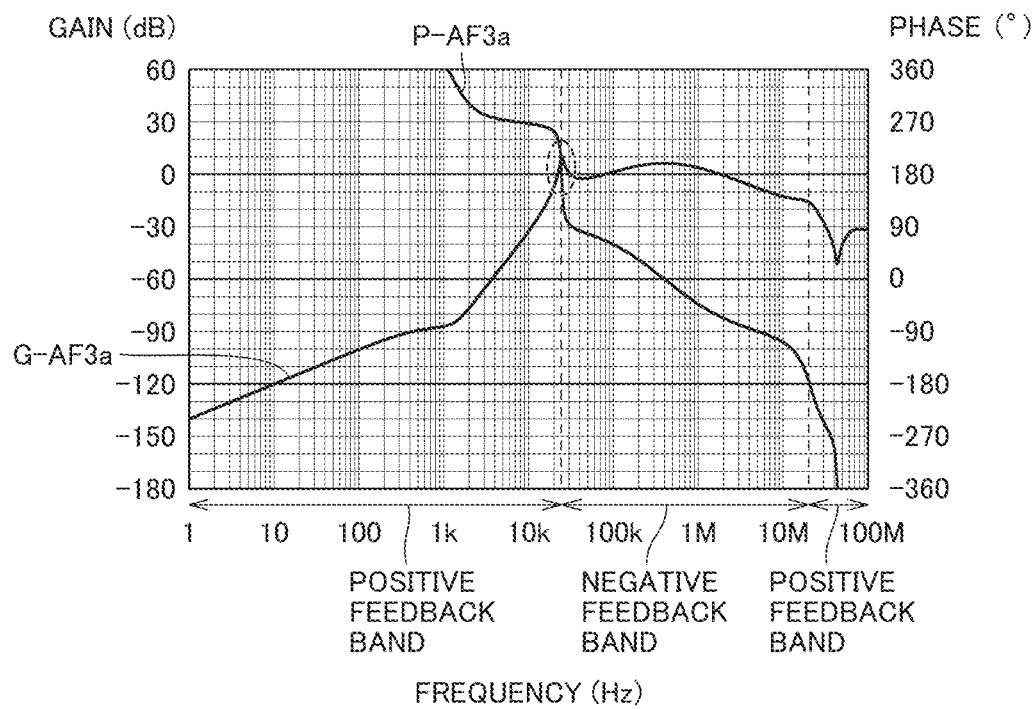
(b)
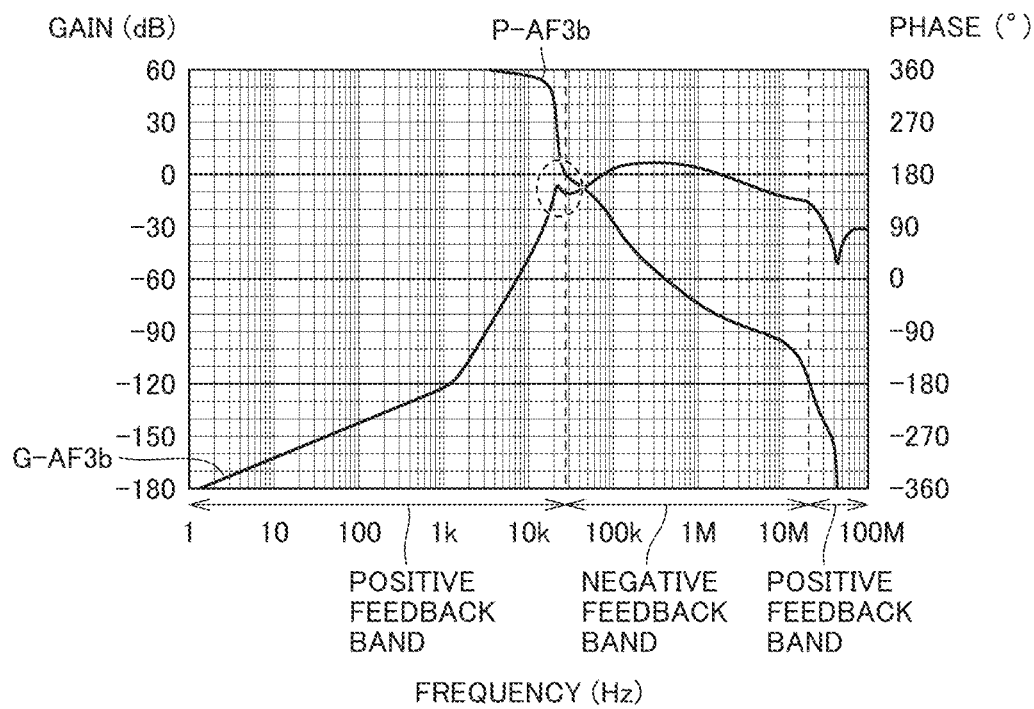

FIG.11
(a)
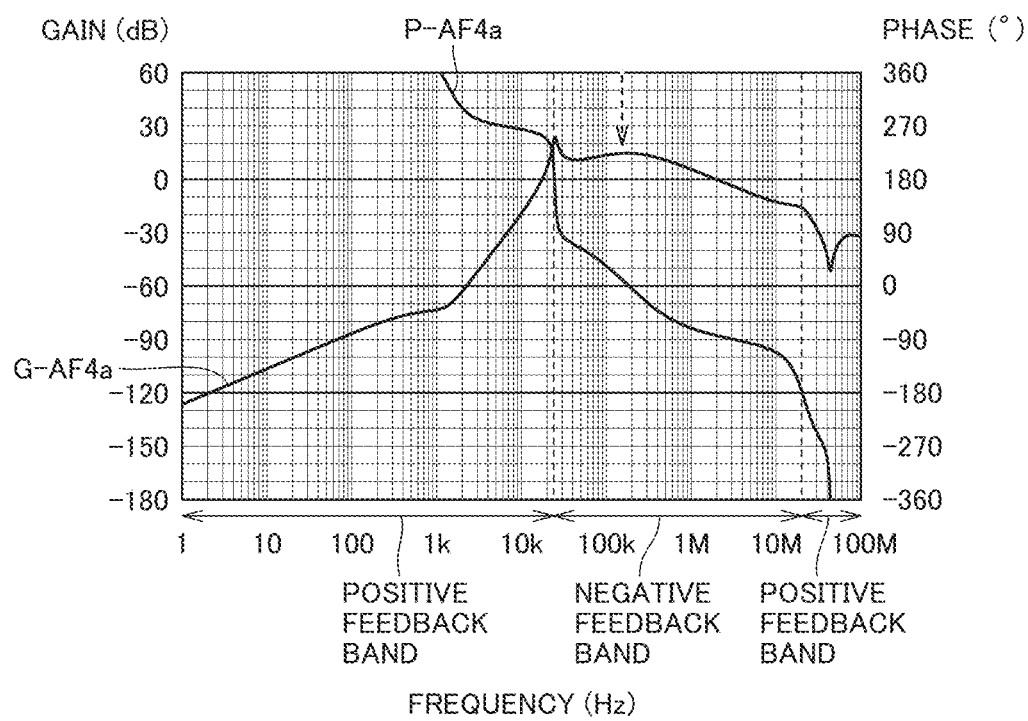
(b)
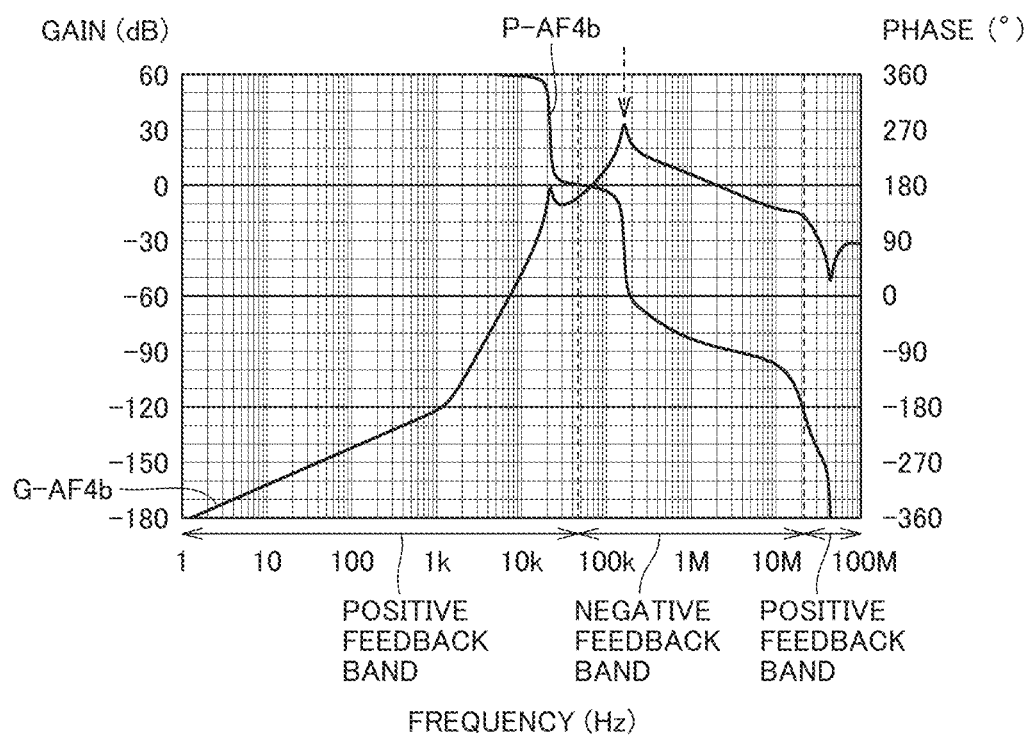

FIG.12
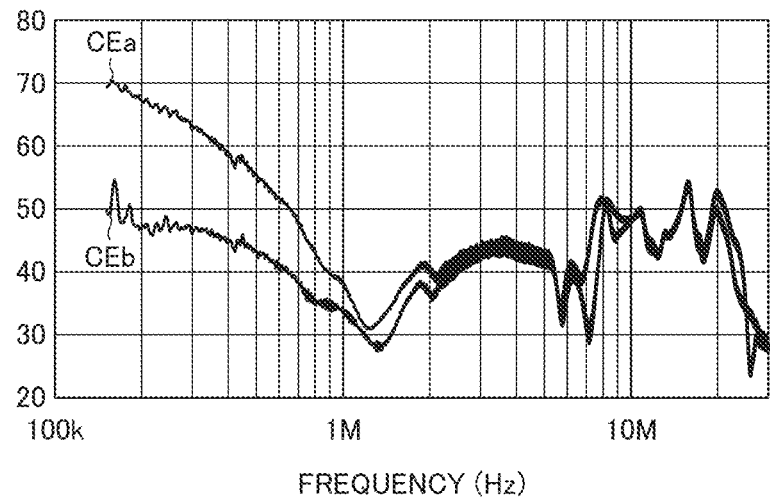
FIG.13
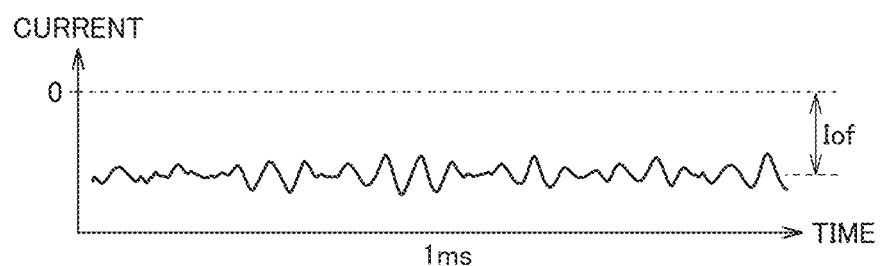
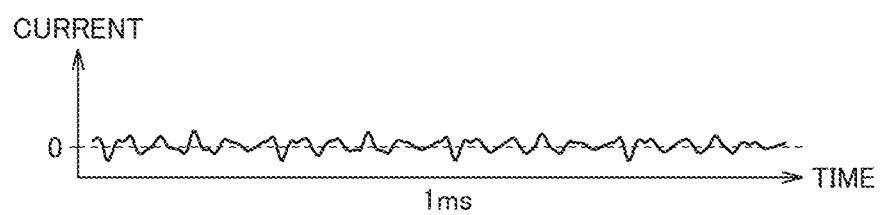

NOISE REDUCTION DEVICE

CROSS-REFERENCE TO RELATED APPLICATION

The present application is based on PCT filing PCT/JP2020/013042, filed Mar. 24, 2020, the entire contents of which is incorporated herein by reference.

TECHNICAL FIELD

The present disclosure relates to a noise reduction device.

BACKGROUND ART

With the widespread use of power electronics devices, failures due to electromagnetic noise (hereinafter, also simply referred to as noise) generated from the power electronics devices are increasing. Regulations on noise have been spreading worldwide, and it is required to sufficiently reduce noise more than before.

As a conventional example of the noise reduction method, a noise reduction device (so-called active filter) using an active element such as a transistor and an operational amplifier is known. As a basic configuration of the active filter, a function of detecting noise to be reduced existing in the main circuit, a function of generating a compensation voltage or a compensation current for reducing the detected noise by the active element, and a function of injecting the generated compensation voltage or compensation current into a main circuit are usually required.

Japanese Patent Laying-Open No. 2002-10650 (see PTL 1) discloses, as an active filter for reducing a common mode current, a configuration in which a compensation current is generated by an active filter including a buffer amplifier to which an output of a current transformer that monitors the common mode current is input.

CITATION LIST

Patent Literature

PTL 1: Japanese Patent Laying-Open No. 2002-10650

SUMMARY OF INVENTION

Technical Problem

The configuration described in PTL 1 proposes a method of adjusting an input bias current of an active element (operational amplifier), by which method an offset signal of the active element can be compensated.

However, PTL 1 does not mention a method of suppressing a signal that amplifies noise by a phase delay generated in the compensation current. Furthermore, as described in PTL 1, control methods related to noise reduction of the active filter include a feedback control method and a feedforward control method.

Considering the influence of the phase delay on these control methods, in the feedforward control method, a noise amplified signal caused by the phase delay only amplifies the noise existing in the main circuit as it is. On the other hand, in the feedback control method, the noise amplified signal caused by the phase delay causes positive feedback of the noise, and this may cause the active filter to oscillate and make the operation unstable. Therefore, in the feedback control method, it is particularly desired to suppress the noise amplified signal caused by the phase delay.

In addition, in the active filter of the feedback control method, it is required to increase the gain of the feedback loop in order to enhance the noise reduction effect, but the increase in the gain may also increase the noise amplified signal caused by the phase delay. For this reason, in the active filter of the feedback control method, it tends to be difficult to obtain a high noise reduction effect while suppressing oscillation.

The present disclosure has been made in view of the above problems, and an object of the present disclosure is to provide a noise reduction device of a feedback control method having high stability and a high noise reduction effect.

Solution to Problem

According to one aspect of the present disclosure, a noise reduction device includes a noise detector, a compensation signal generator, a compensation signal injector, a compensation signal detector, a low-frequency component subtraction unit, and an intermediate frequency component addition unit. The noise detector detects electromagnetic noise on a connection line. The compensation signal generator generates a compensation signal for canceling the electromagnetic noise on the basis of a detection signal of the noise detector. The compensation signal injector injects the compensation signal into the connection line. The compensation signal detector detects the compensation signal. The low-frequency component subtraction unit amplifies a first frequency component in a first frequency region that is lower than a predetermined first frequency in a detection signal detected by the compensation signal detector, and negatively feeds back the amplified first frequency component to the compensation signal generator. The intermediate frequency component addition unit positively feeds back a component of a predetermined second frequency that is higher than the first frequency in the detection signal detected by the compensation signal detector to the compensation signal generator.

Advantageous Effects of Invention

According to the present disclosure, a negative minor feedback loop for suppressing a low-frequency component (first frequency component) of a compensation signal and a positive minor feedback loop for amplifying a second frequency component of the compensation signal act on a feedback control loop for generating a compensation signal for canceling an electromagnetic noise detected by a noise detector, so that it is possible to realize a highly stable noise reduction device of a feedback control method in which a noise reduction effect of the second frequency is enhanced.

BRIEF DESCRIPTION OF DRAWINGS

FIG. 6 is a graph illustrating an analysis result of a loop transfer function of a major feedback loop of the noise reduction device according to the second embodiment.

FIG. 7 is a graph illustrating an analysis result of a loop transfer function of a minor feedback loop of the noise reduction device according to the second embodiment.

FIG. 8 is a graph illustrating an analysis result of a loop transfer function of a minor feedback loop of the noise reduction device according to a third embodiment.

FIG. 9 is a graph illustrating an analysis result of a loop transfer function of a major feedback loop of the noise reduction device according to the third embodiment.

FIG. 11 is a graph illustrating an analysis result of a loop transfer function of a major feedback loop of the noise reduction device according to the fourth embodiment.

FIG. 12 is a graph illustrating an actual measurement result of a noise reduction effect by the noise reduction device according to the fourth embodiment.

FIG. 13 is an example of an actual measured waveform of a compensation signal in the noise reduction device according to the fourth embodiment.

DESCRIPTION OF EMBODIMENTS

Figure 1:
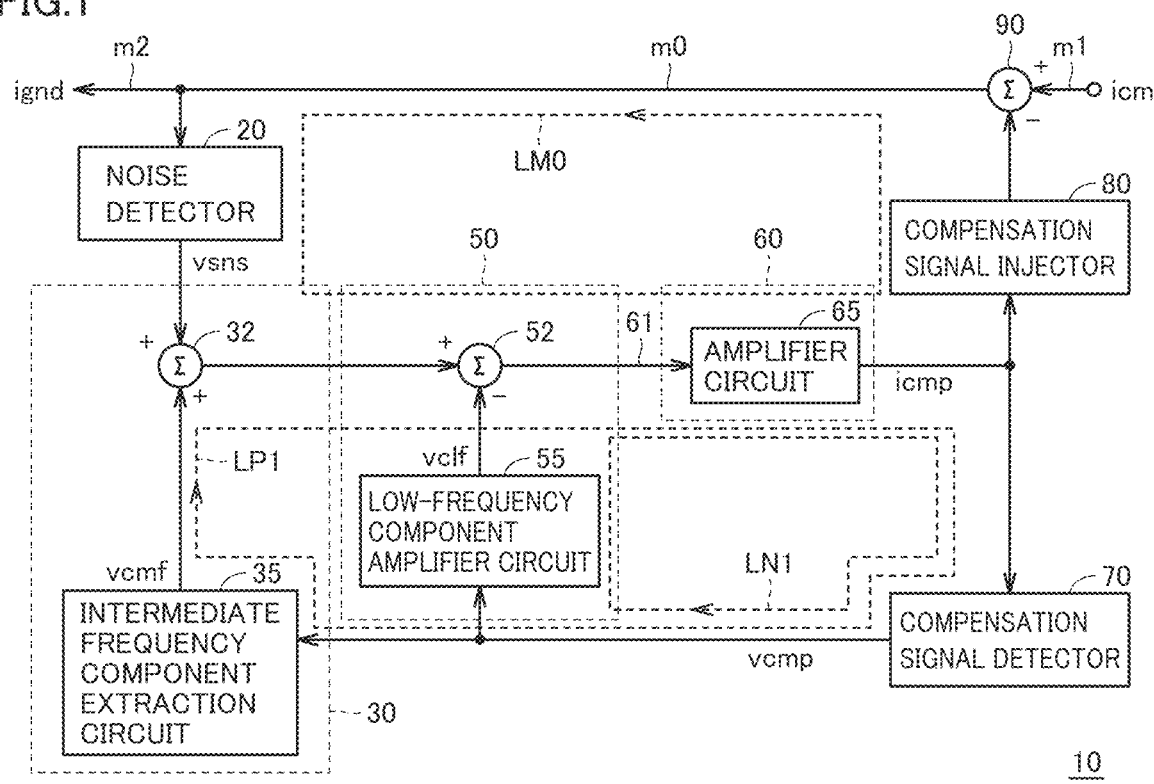
FIG. 1 is a control block diagram of a noise reduction device according to a first embodiment.

Embodiments of the present disclosure will be described in detail with reference to the drawings. In the following description, the same or corresponding parts in the drawings are denoted by the same reference numerals, and descriptions thereof will not be repeated in principle.

In addition, the embodiments described below exemplify an apparatus and a method for embodying the technical idea of the present disclosure, and the technical idea of the present disclosure does not specify the material, shape, structure, arrangement, and the like of the components as follows. Various modifications can be made to the technical idea of the present disclosure within the technical scope defined by the claims described in the claims.

First Embodiment

FIG. 1 is a control block diagram of a noise reduction device according to a first embodiment.

Referring to FIG. 1, a noise reduction device 10 according to the first embodiment includes a noise detector 20, an intermediate frequency component addition unit 30, a low-frequency component subtraction unit 50, a compensation signal generator 60, a compensation signal detector 70, a compensation signal injector 80, and a connection line m0.

Connection line m0 is connected to a noise source current input line m1 that inputs a noise source current icm via a subtractor-type operator 90. Compensation signal injector 80 is connected to connection line m0 via a subtractor-type operator 90.

Noise detector 20 is connected to connection line m0 in such a manner as to sandwich connection line m0 together with subtractor-type operator 90. As described later, noise detector 20 can be configured by a current transformer or a capacitor. Furthermore, noise detector 20 is connected to a leakage noise current output line m2 that outputs a leakage noise current ignd on an opposite side of a side connected with connection line m0. Noise detector 20 outputs a detection voltage vsns that changes according to the current of connection line m0. Therefore, detection voltage vsns includes an electromagnetic noise component.

Intermediate frequency component addition unit 30 includes an adder-type operator 32 and an intermediate frequency component extraction circuit 35. Intermediate frequency component addition unit 30 is connected to an input line 61 of the compensation signal generator via a subtractor-type operator 52 in low-frequency component subtraction unit 50.

Low-frequency component subtraction unit 50 includes subtractor-type operator 52 and a low-frequency component amplifier circuit 55. Low-frequency component amplifier circuit 55 is connected to input line 61 of the compensation signal generator via subtractor-type operator 52. Compensation signal generator 60 includes an amplifier circuit 65. Amplifier circuit 65 amplifies a voltage of input line 61 and generates a compensation signal icmp corresponding to a compensation current.

Compensation signal detector 70 outputs a compensation signal detection voltage vcmp corresponding to compensation signal icmp. Intermediate frequency component addition unit 30 generates an output signal vcmf obtained by extracting a predetermined intermediate frequency component of compensation signal detection voltage vcmp. Similarly, low-frequency component amplifier circuit 55 generates an output signal vclf obtained by extracting a low-frequency component of compensation signal detection voltage vcmp.

Noise reduction device 10 forms a feedback loop LM0 that passes through connection line m0, noise detector 20, compensation signal generator 60, compensation signal injector 80, and subtractor-type operator 90. Hereinafter, this feedback loop is defined as a "major feedback loop".

In major feedback loop LM0, since negative feedback is formed by subtractor-type operator 90, feedback control is performed so that the electromagnetic noise present in connection line m0 becomes 0. Specifically, compensation signal icmp injected by subtractor-type operator 90 is generated on the basis of detection voltage vsns by noise detector 20 so as to cancel the electromagnetic noise component. However, actually, the electromagnetic noise remains in connection line m0 as residual deviation according to the magnitude of a gain of the major feedback loop.

Compensation signal detection voltage vcmp from compensation signal detector 70 is input to low-frequency component amplifier circuit 55. As a result, low-frequency component subtraction unit 50 forms a feedback loop LN1 that passes through low-frequency component amplifier circuit 55, subtractor-type operator 52, compensation signal generator 60, and compensation signal detector 70.

In feedback loop LN1, a negative feedback is formed by subtractor-type operator 52. Therefore, this feedback loop is defined as a "negative minor feedback loop".

In negative minor feedback loop LN1, feedback control is performed such that a low-frequency component in compensation signal icmp according to a loop transfer function (frequency characteristic) of the negative minor feedback loop is set to 0 by forming a negative feedback.

The low-frequency component in compensation signal icmp causes unnecessary power consumption or narrows an amplitude of the voltage and the current output in compensation signal generator 60. Furthermore, forming positive feedback in the major feedback loop may cause closed-loop oscillation.

Therefore, reducing the low-frequency component in compensation signal icmp by negative minor feedback loop LN1 can bring about effects of suppressing unnecessary power consumption, securing the amplitude of the voltage and the current output, and improving the operation stability by suppressing the closed-loop oscillation in major feedback loop LM0.

Compensation signal detection voltage vcmp from compensation signal detector 70 is input to intermediate frequency component extraction circuit 35. As a result, intermediate frequency component addition unit 30 forms a feedback loop LP1 that passes through intermediate frequency component extraction circuit 35, adder-type operator 32, compensation signal generator 60, and compensation signal detector 70.

In feedback loop LP1, a positive feedback is formed by adder-type operator 32. Therefore, this feedback loop is defined as a "positive minor feedback loop". In positive minor feedback loop LP1, feedback control is performed such that an intermediate frequency component in compensation signal icmp according to a loop transfer function (frequency characteristic) of the positive minor feedback loop is amplified by forming the positive feedback.

The intermediate frequency can be variably set by adjusting a loop transfer function (frequency characteristic) of positive minor feedback loop LP1. Therefore, by adjusting the loop transfer function of positive minor feedback loop LP1 so that the intermediate frequency is set to an arbitrary frequency of the noise reduction target, noise reduction device 10 can exhibit a high noise reduction effect at an arbitrary frequency.

However, it is known that a gain of positive minor feedback loop LP1 generally needs to be less than 1. This is because, in a case where the gain is 1 or more, positive minor feedback loop LP1 generates closed-loop oscillation, whereby a signal equal to or larger than an input limit value is input to compensation signal generator 60 and the like, and there is a possibility that a desired noise reduction operation cannot be realized.

As described above, in noise reduction device 10, compensation signal icmp that acts as the noise cancellation component by major feedback loop LM0 under an action of positive minor feedback loop LP1 and negative minor feedback loop LN1 is generated. As a result, compensation signal icmp is generated such that the component of the frequency (intermediate frequency) of the noise reduction target is amplified by positive minor feedback loop LP1 and the low-frequency component is reduced by negative minor feedback loop LN1.

Therefore, in the noise reduction device according to the first embodiment, it is possible to obtain a high noise reduction effect by amplification of the intermediate frequency component while achieving low power consumption and operation stabilization by suppressing the low-frequency component (including the offset component) of compensation signal icmp.

Second Embodiment

Figure 2:
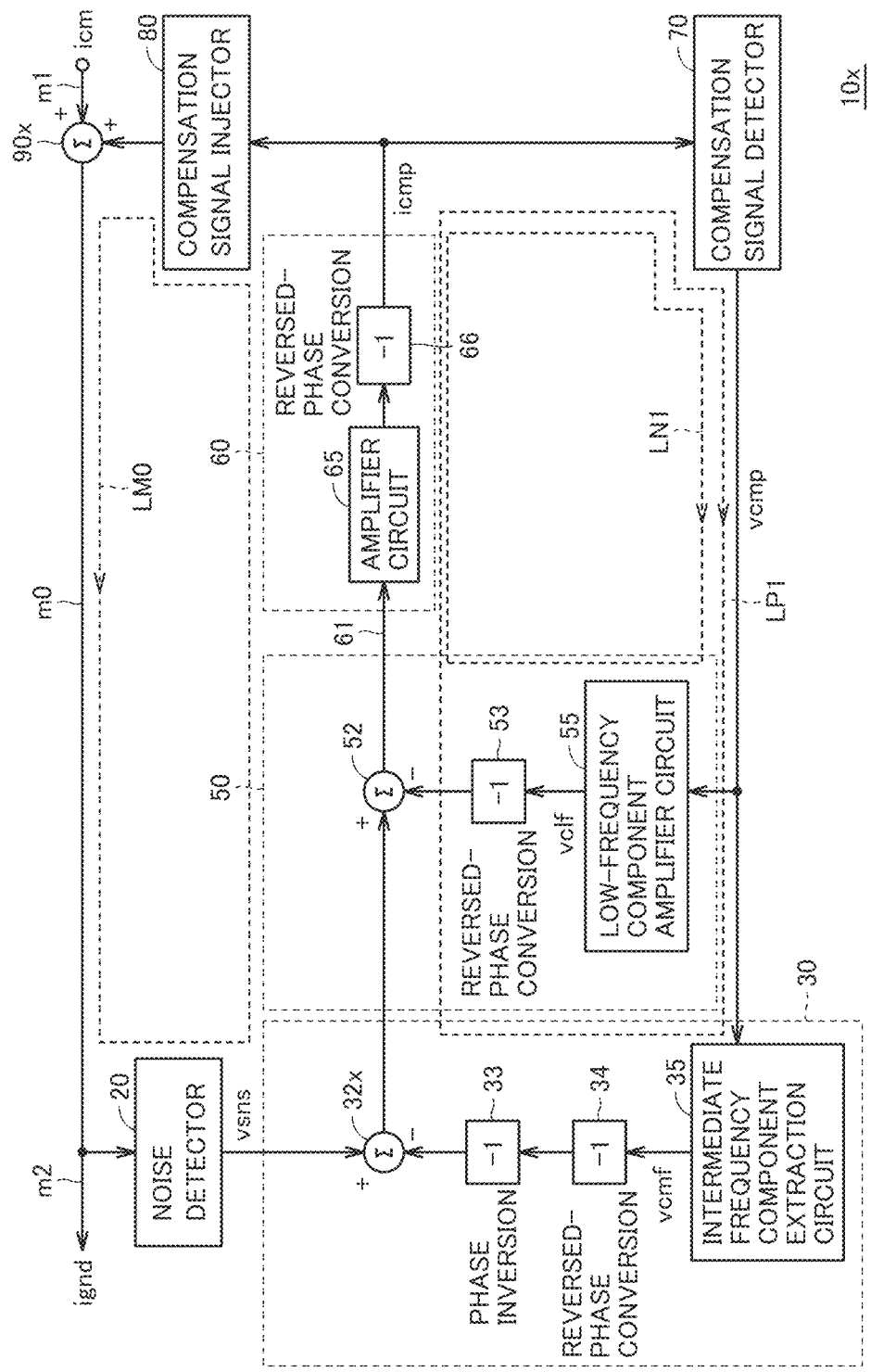
FIG. 2 is a control block diagram of a noise reduction device according to a second embodiment.

FIG. 2 is a control block diagram of a noise reduction device 10x according to a second embodiment. Noise reduction device 10x according to the second embodiment corresponds to a modification of the control block of noise reduction device 10 illustrated in FIG. 1 into a configuration suitable for implementation.

Referring to FIG. 2, noise reduction device 10x according to the second embodiment is different from noise reduction device 10 illustrated in FIG. 1 in the following points.

Compensation signal generator 60 further includes a reversed-phase conversion element 66 in addition to amplifier circuit 65. Therefore, in FIG. 2, a phase of compensation signal icmp output from compensation signal generator 60 is inverted from that of compensation signal icmp in FIG. 1.

In connection line m0, an adder-type operator 90x is arranged instead of subtractor-type operator 90 in FIG. 1. Therefore, compensation signal icmp from compensation signal generator 60 is injected into connection line m0 via adder-type operator 90x.

Intermediate frequency component addition unit 30 further includes a phase inversion element 33 and a reversed-phase conversion element 34 in addition to intermediate frequency component extraction circuit 35. In addition, a subtractor-type operator 32x is arranged instead of adder-type operator 32. Output signal vcmf of intermediate frequency component extraction circuit 35 is input to a negative side of operator 32x after reversed-phase conversion and phase inversion.

Low-frequency component subtraction unit 50 further includes a reversed-phase conversion element 53 in addition to subtractor-type operator 52 and low-frequency component amplifier circuit 55. Output signal vclf of low-frequency component amplifier circuit 55 is input to a negative side of operator 52 after the reversed-phase conversion.

Reversed-phase conversion elements 34, 53, and 66 can be configured using, for example, an inverting amplifier circuit configured by an operational amplifier or a transistor. Furthermore, phase inversion element 33 can be configured using phase inversion that occurs as a result of adjusting a phase delay at a high frequency of an operational amplifier or a transistor.

A configuration of noise reduction device 10x according to the second embodiment other than the above points is the same as that of noise reduction device 10 illustrated in FIG. 1, and thus a detailed description thereof is not be repeated.

In noise reduction device 10x according to the second embodiment, the phase of compensation signal icmp from compensation signal generator 60 is inverted as compared with the control configuration of FIG. 1. However, compensation signal icmp is injected into connection line m0 via adder-type operator 90x instead of subtractor-type operator 90 in FIG. 1. Therefore, it is understood that compensation signal icmp injected into connection line m0 has the same phase between FIGS. 1 and 2.

On the other hand, in FIG. 2, a phase of compensation signal detection voltage vcmp from compensation signal detector 70 is also inverted from that in FIG. 1. However, in low-frequency component subtraction unit 50, output signal vclf of low-frequency component amplifier circuit 55 is input to subtractor-type operator 52 (− side) after the reversed-phase conversion. Therefore, it is understood that the sign (positive/negative) of compensation signal detection voltage vcmp acting on an operation in operator 52 is the same in FIGS. 1 and 2.

In intermediate frequency component addition unit 30, output signal vcmf generated by intermediate frequency component extraction circuit 35 from compensation signal detection voltage vcmp whose phase has been inverted from FIG. 1 is subjected to phase inversion after reversed-phase conversion, and is input to subtractor-type operator 32x (− side). Therefore, it is understood that the sign (positive/ negative) of compensation signal detection voltage vcmp acting on the operation is the same between the operator 32 (adder type) in FIG. 1 and operator 32x (subtractor type) in FIG. 2.

As described above, the signs of compensation signal icmp, output signal vcmf related to the intermediate frequency, and output signal vclf related to the low frequency, which act in the operations of operators 90 and 90x, operator 52, and operators 32 and 32x, are the same between FIG. 2 and FIG. 1. Therefore, it is understood that the same control contents are realized in noise reduction device 10x of FIG. 2 and noise reduction device 10 of FIG. 1.

In noise reduction device 10x according to the second embodiment, since operator 52 in low-frequency component subtraction unit 50 and operator 32x in intermediate frequency component addition unit 30 can both be configured as operators of a subtractor type, it is possible to integrate these operators into a common circuit at the time of hardware implementation.

In addition, as described later, by applying adder-type operator 90x to connection line m0, the number of hardware options constituting compensation signal injector 80 increases.

Figure 3:
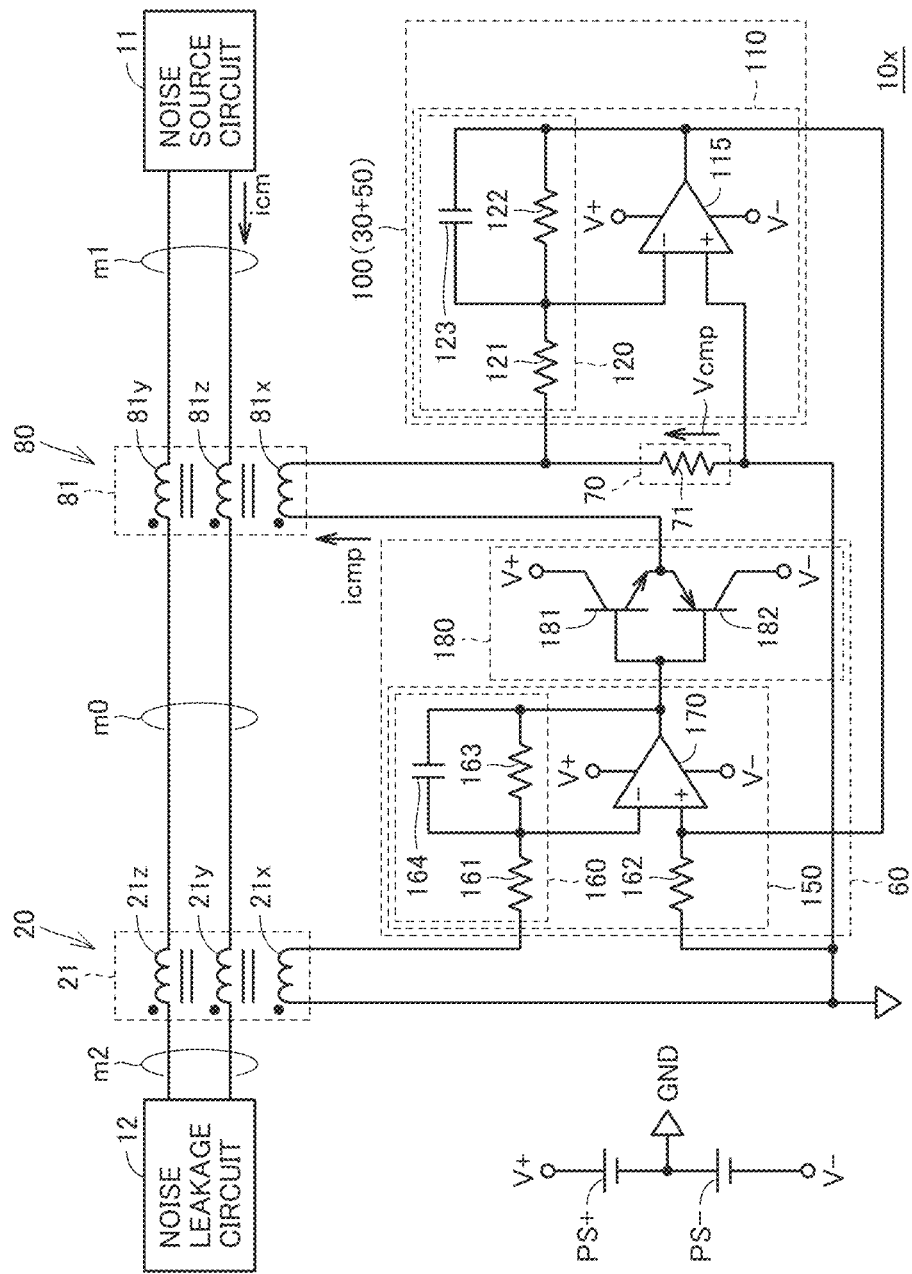
FIG. 3 is an electric circuit diagram for realizing the control block diagram of FIG. 2 by hardware.

FIG. 3 is an electric circuit diagram for realizing the control block diagram of noise reduction device 10x illustrated in FIG. 2 by hardware.

Referring to FIG. 3, noise reduction device 10x according to the second embodiment includes connection line m0, noise detector 20, compensation signal generator 60, compensation signal injector 80, compensation signal detector 70, and a common circuit 100 having the functions of intermediate frequency component addition unit 30 and low-frequency component subtraction unit 50.

A noise source circuit 11 that generates noise source current icm illustrated in FIG. 1 is connected to noise source current input line m1. Noise source circuit 11 is, for example, an inverter circuit, and generates a noise source current by switching of a semiconductor element for power conversion.

A noise leakage circuit 12 is connected to leakage noise current output line m2. Noise leakage circuit 12 is a general term for a circuit group in which malfunction due to inflow of noise is concerned, and is for example, an integrated circuit (IC), a system power supply constituting a power supply path to the IC, or the like.

For example, it is assumed that a configuration in which, between two electric devices connected to the same system power supply, in one electric device, a voltage of the system power supply is AC-DC converted by a rectifier circuit, and then power is supplied from an inverter circuit that performs DC-AC conversion to a load such as a motor. In such a configuration, the inverter circuit of the one electric device serves as noise source circuit 11, and noise generated by the inverter circuit flows into noise leakage circuit 12 (for example, an IC or the like), which is a component of the other electric device, via the rectifier circuit and the system power supply, so that there is a concern that malfunction or the like may occur.

Hereinafter, in the present embodiment, assuming that the noise reduction device is connected to a single-phase AC system, the description is given taking connection line m0, noise source current input line m1, and leakage noise current output line m2 as two lines.

Noise detector 20 includes a current transformer 21. Current transformer 21 has primary windings 21y and 21z interposed in connection line m0, and a secondary winding 21x. Primary windings 21y, 21z and secondary winding 21x are magnetically coupled, and a voltage that changes according to the current flowing through connection line m0 is generated in secondary winding 21x as detection voltage vsns illustrated in FIG. 1. Detection voltage vsns includes a voltage component reflecting the electromagnetic noise component in the current of connection line m0.

Compensation signal injector 80 includes a current transformer having a primary winding 81x and secondary windings 81y and 81z that are magnetically coupled to each other. Secondary windings 81y and 81z are interposed in connection line m0. Compensation signal icmp, which is an output current of compensation signal generator 60, flows through primary winding 81x.

As a result, by generating an AC voltage according to compensation signal (current) icmp in secondary windings 81y and 81z, the injection of compensation signal icmp into connection line m0 described with reference to FIGS. 1 and 2 is realized. Note that the sign (positive/negative) of operator 90 or 90x connected to signal injector 80 in FIGS. 1 and 2 can be created separately according to the polarity of magnetic coupling between primary winding 81x and secondary windings 81y and 81z.

Note that, although illustration is omitted, noise detector 20 can be configured by a capacitor as known. In addition, a capacitor can also be applied to signal injector 80 by adopting the control configuration of FIG. 2 using adder-type operator 90x.

Compensation signal generator 60 includes a differential inverting amplifier circuit 150 and an emitter follower 180. Differential inverting amplifier circuit 150 includes an operational amplifier 170 and a phase shifter circuit 160 of operational amplifier 170. Phase shifter circuit 160 includes a negative input resistor 161, a feedback resistor 163, and a feedback capacitor 164. Furthermore, a positive input resistor 162 is connected to an input terminal (+ side) of operational amplifier 170. Phase shifter circuit 160 is connected between an input terminal (− side) and an output terminal of operational amplifier 170. The phase difference between the input and the output of differential inverting amplifier circuit 150 can be adjusted by phase shifter circuit 160. Negative input resistor 161, feedback resistor 163, and feedback capacitor 164 constitute a low-pass filter.

Emitter follower 180 includes transistors 181 and 182 having control electrodes connected to the output terminal of operational amplifier 170. Transistors 181 and 182 are connected in series between a positive power supply node (V+) and a negative power supply node (V−). Compensation signal icmp, which is an output of compensation signal generator 60, is generated at a connection node of transistors 181 and 182. By connecting primary winding 81x of current transformer 81 between a connection node of transistors 181 and 182 and the ground (GND), as illustrated in FIG. 2, compensation signal icmp can be injected into connection line m0 via signal injector 80.

When a power operational amplifier having high current driving capability is used as operational amplifier 170, the arrangement of emitter follower 180 can be omitted. Alternatively, differential inverting amplifier circuit 150 can be configured using a transistor without using an operational amplifier.

A detection resistor 71 constituting compensation signal detector 70 is connected between primary winding 81x of current transformer 81 and the ground (GND). As a result, a compensation signal detection voltage vcmp proportional to the current value of compensation signal icmp is generated in detection resistor 71.

Common circuit 100 having the functions of intermediate frequency component addition unit 30 and low-frequency component subtraction unit 50 is configured by an inverting amplifier circuit 110. Inverting amplifier circuit 110 includes an operational amplifier 115 and a phase shifter circuit 120 of operational amplifier 115. Phase shifter circuit 120 includes a negative input resistor 121, a feedback resistor 122, and a feedback capacitor 123. The phase difference between the input and output of inverting amplifier circuit 110 can be adjusted by phase shifter circuit 120. Negative input resistor 121, feedback resistor 122, and feedback capacitor 123 constitute a low-pass filter.

Negative input resistor 121 and detection resistor 71 are input between input terminals of operational amplifier 115. As a result, the input voltage of operational amplifier 115 is set to compensation signal detection voltage vcmp, so that compensation signal detection voltage vcmp is input to intermediate frequency component addition unit 30 and low-frequency component subtraction unit 50, as illustrated in FIG. 2.

In addition, an output terminal of inverting amplifier circuit 110 is connected to an input terminal (+ side) of operational amplifier 170 of compensation signal generator 60. Therefore, differential inverting amplifier circuit 150 amplifies a voltage difference between detection voltage vsns from noise detector 20 and the output signal of inverting amplifier circuit 110 to generate compensation signal icmp. As a result, a minor loop of compensation signal icmp is configured. Although not illustrated, inverting amplifier circuit 110 can also be configured using a transistor without using an operational amplifier.

Operational amplifiers 115 and 170 and transistors 181 and 182 operate by receiving supply of power supply voltages V+(positive voltage) and V− (negative voltage). For example, power supply voltages V+ and V− can be supplied by a positive DC power supply PS+ and a negative DC power supply PS− connected in series via the ground (GND). Each of DC power supplies PS+ and PS− can be configured by a DC stabilizing power supply that outputs a positive voltage. Alternatively, it is also possible to obtain a DC power supply by rectifying an AC current flowing through noise leakage circuit 12 and supplying the rectified AC current to a switching power supply circuit (not illustrated).

By the inversion amplification of inverting amplifier circuit 110, the functions of both reversed-phase conversion elements 34 and 53 in FIG. 2 are realized. Similarly, the function of reversed-phase conversion element 66 in FIG. 2 is realized by the inversion amplification of differential inverting amplifier circuit 150. In addition, the function of phase inversion element 33 in FIG. 2 is realized by adjusting the phase delay of inverting amplifier circuit 110 by adjusting the circuit constant of phase shifter circuit 120. Specifically, it can be realized by giving a phase delay of −180° to the frequency component corresponding to the intermediate frequency.

Also in the configuration of FIG. 3, noise reduction device 10x forms a major feedback loop LM0 that passes through connection line m0, noise detector 20, compensation signal generator 60, and compensation signal injector 80. In major feedback loop LM0, since the negative feedback is formed by differential inverting amplifier circuit 150, feedback control is executed so that the electromagnetic noise present in connection line m0 becomes 0. However, as described above, in the actual control operation, the electromagnetic noise remains in connection line m0 as residual deviation according to the magnitude of a gain of major feedback loop LM0.

The gain of major feedback loop LM0 can be increased by setting the turn ratio between primary windings 21y and 21z and secondary winding 21x in noise detector 20 or by adjusting the gain of differential inverting amplifier circuit 150 in compensation signal generator 60.

A minor feedback loop is formed through inverting amplifier circuit 110 integrally forming intermediate frequency component addition unit 30 and low-frequency component subtraction unit 50, compensation signal generator 60, and compensation signal detector 70.

Since the minor feedback loop forms negative feedback, feedback control is performed such that a low-frequency component in compensation signal icmp according to the loop transfer function (frequency characteristic) of the minor feedback loop is set to zero.

Furthermore, the minor feedback loop forms positive feedback by generating a signal that has been subjected to phase inversion at a certain frequency or more according to a loop transfer function (frequency characteristic) of the minor feedback loop. By the positive feedback, the feedback control can be performed such that the intermediate frequency component in compensation signal icmp according to the loop transfer function (frequency characteristic) of the minor feedback loop is amplified.

That is, in the minor feedback loop passing through inverting amplifier circuit 110, compensation signal generator 60, and compensation signal detector 70 in FIG. 3, positive minor feedback loop LP1 for the intermediate frequency and negative minor feedback loop LN1 for the low-frequency component in FIGS. 1 and 2 can be equivalently formed using frequency regions different from each other in the loop transfer function (frequency characteristic) of the minor feedback loop.

Therefore, by adjusting the loop transfer function (frequency characteristic) of the minor feedback loop such that the frequency region (intermediate frequency) in which the positive minor feedback loop is equivalently formed corresponds to an arbitrary frequency of the noise reduction target, a high noise reduction effect can be exhibited at an arbitrary frequency. However, as described in the first embodiment, the gain of the positive minor feedback loop needs to be less than 1. This is because closed loop oscillation occurs in the positive feedback when the gain is 1 or more.

In addition, at the frequency of the low-frequency component in compensation signal icmp, the loop transfer function (frequency characteristic) of the minor feedback loop can be adjusted such that a negative minor feedback loop is equivalently formed. As a result, it is possible to bring about effects of suppressing unnecessary power consumption, securing amplitudes of voltage and current outputs, and stabilizing operation by suppressing closed-loop oscillation in major feedback loop LM0.

The loop transfer function (frequency characteristic) of the minor feedback loop, the gain of the positive minor feedback loop, and the intermediate frequency in FIG. 3 can be changed to arbitrary characteristics by adjusting circuit constants in compensation signal generator 60, compensation signal detector 70, intermediate frequency component addition unit 30, and low-frequency component subtraction unit 50 (inverting amplifier circuit 110).

Figure 4:
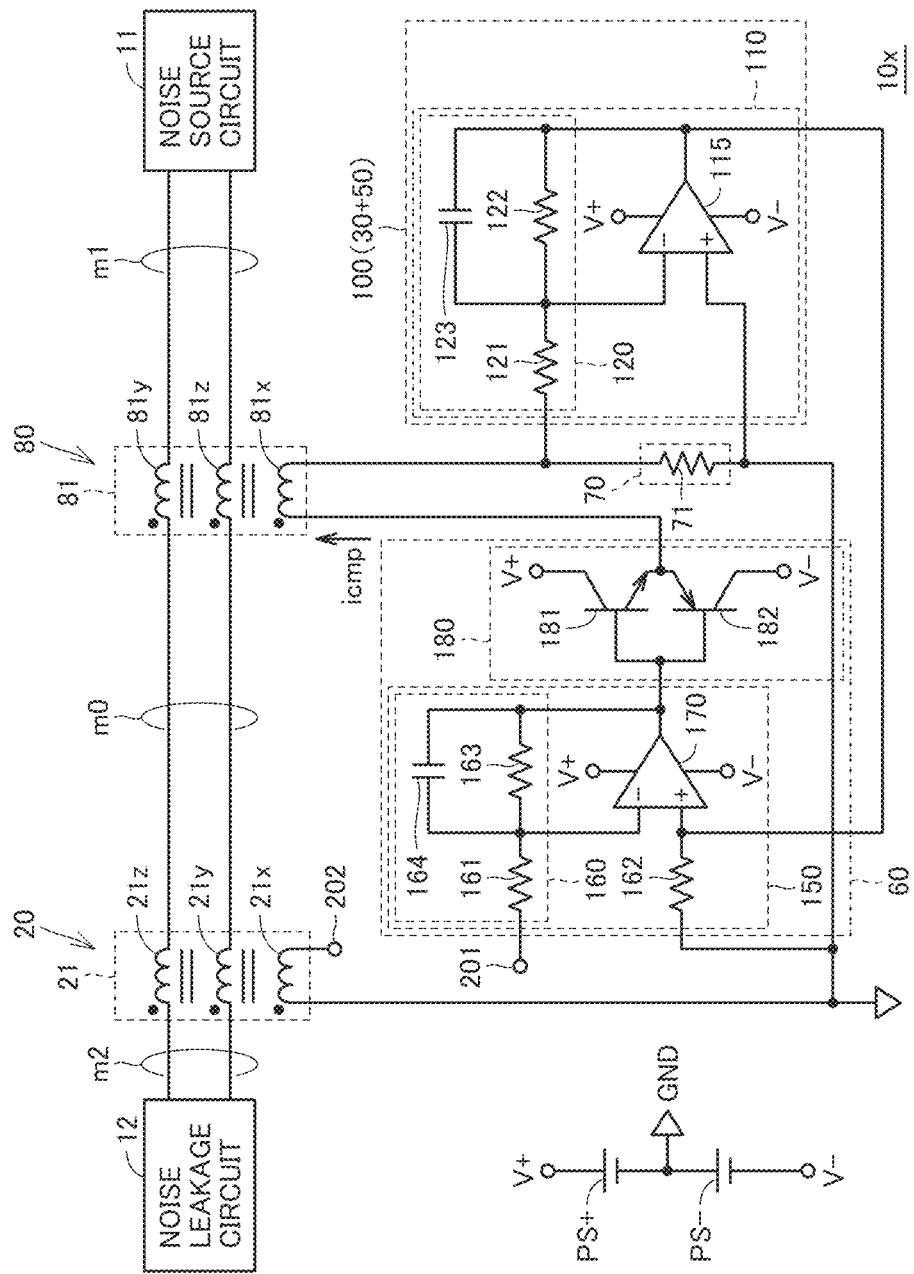
FIG. 4 is an electric circuit diagram for evaluating a loop transfer function of a major feedback loop of the noise reduction device illustrated in FIG. 3.

FIG. 4 is an electric circuit diagram for evaluating the loop transfer function of the major feedback loop of noise reduction device 10x illustrated in FIG. 3.

Referring to FIG. 4, in order to evaluate the loop transfer function of major feedback loop LM0, the wiring between noise detector 20 and negative input resistor 161 in compensation signal generator 60 is opened, and a voltage input terminal 201 and a voltage measurement terminal 202 are provided. By circuit simulation using such a circuit as an analysis target, a loop transfer function of the major feedback loop was obtained.

Specifically, voltage input terminal 201 is provided on a side of negative input resistor 161, and voltage measurement terminal 202 is provided on a side of noise detector 20. Further, when the loop transfer function of the major feedback loop is evaluated, the minor feedback loop by inverting amplifier circuit 110 was a closed loop. On voltage measurement terminal 202, a voltage corresponding to the current of connection line m0 injected with compensation signal icmp generated by compensation signal generator 60, to which a minor feedback loop by inverting amplifier circuit 110 is applied, is generated. At the time of this analysis, the main circuit was in a non-power supply state. The major feedback loop to be analyzed in FIG. 4 corresponds to an example of a "first feedback loop".

Figure 5:
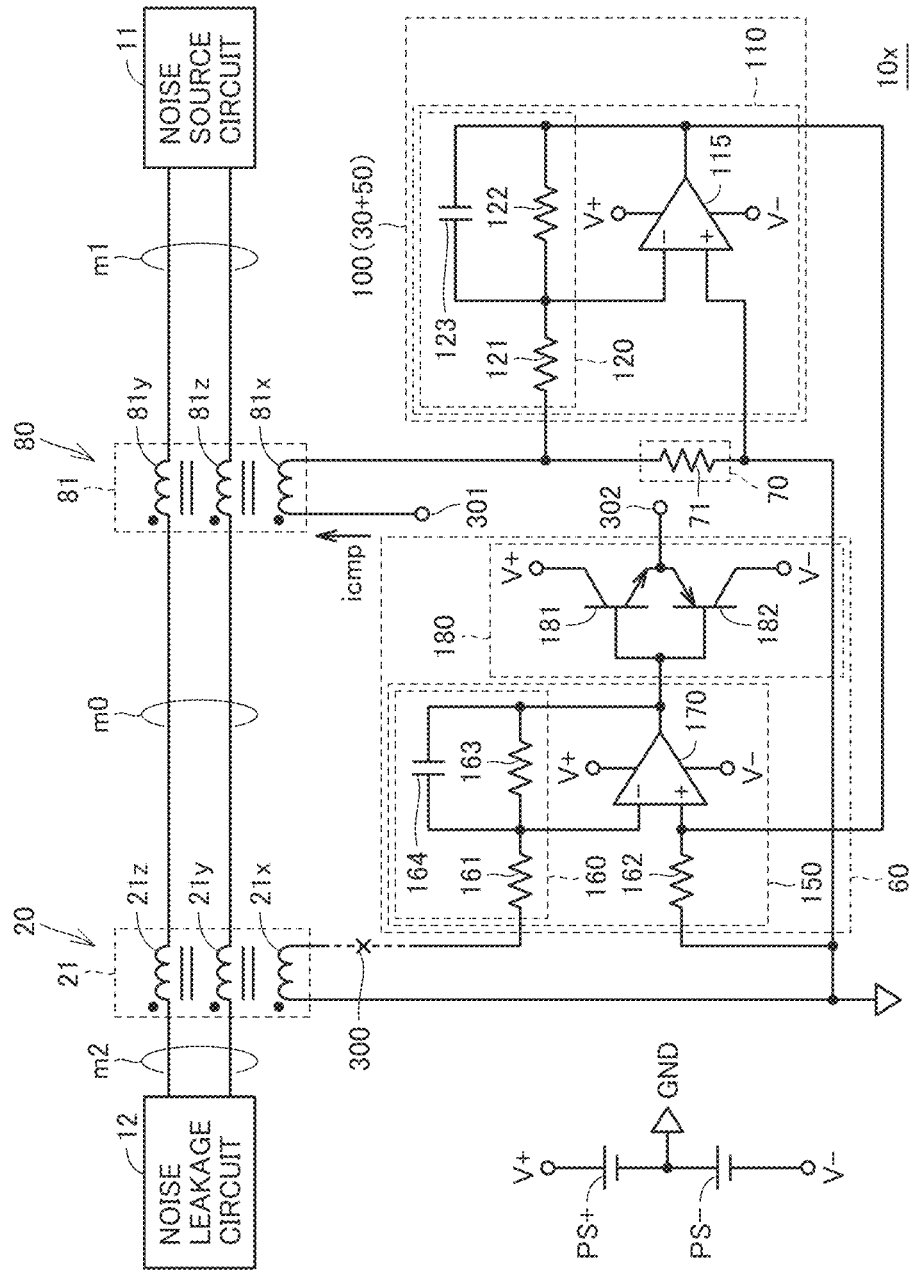
FIG. 5 is an electric circuit diagram for evaluating a loop transfer function of a minor feedback loop of the noise reduction device illustrated in FIG. 3.

FIG. 5 is an electric circuit diagram for evaluating a loop transfer function of a minor feedback loop of noise reduction device 10x illustrated in FIG. 3.

Referring to FIG. 5, in order to evaluate the loop transfer function of the minor feedback loop, similarly to FIG. 4, an opening point 300 is provided in the wiring between noise detector 20 and negative input resistor 161 in compensation signal generator 60. Furthermore, a circuit in which the wiring between compensation signal injector 80 (the primary winding 81x) and the output node of compensation signal generator 60 is opened and a voltage input terminal 301 and a voltage measurement terminal 302 are provided was used as a simulation analysis target.

Specifically, voltage input terminal 301 is provided in compensation signal injector 80 (the primary winding 81x), and voltage measurement terminal 302 is provided on a side of compensation signal generator 60. As described above, when the loop transfer function of the minor feedback loop is evaluated, both the major feedback loop and the minor feedback loop are open loops. Also at the time of this analysis, the main circuit was in the non-power supply state. The minor feedback loop to be analyzed in FIG. 5 corresponds to an example of a "second feedback loop".

FIG. 6 is a graph illustrating an analysis result of a loop transfer function of the major feedback loop of the noise reduction device according to the second embodiment.

FIG. 6(a) illustrates an analysis result for only the major feedback loop by compensation signal generator 60 from which intermediate frequency component addition unit 30 and low-frequency component subtraction unit 50 are removed in the control block diagram of FIG. 2. This analysis target corresponds to a configuration in which inverting amplifier circuit 110 is removed from the configuration of FIG. 4. In FIG. 6(a), a characteristic line G-AFa indicates a gain characteristic with respect to a frequency, and a characteristic line P-AFa indicates a phase characteristic with respect to the frequency. Hereinafter, the configuration to which intermediate frequency component addition unit 30 and low-frequency component subtraction unit 50 are not applied in FIG. 6(a) and the like is also referred to as a "configuration before application of the present embodiment".

On the other hand, FIG. 6(b) illustrates an analysis result of the circuit configuration of FIG. 4 including intermediate frequency component addition unit 30 and low-frequency component subtraction unit 50, as an analysis target. In FIG. 6(b), a characteristic line G-AFb indicates a gain characteristic with respect to the frequency of the major feedback loop, and a characteristic line P-AFb indicates a phase characteristic with respect to the frequency of the major feedback loop.

Hereinafter, the gain on the characteristic line related to the major feedback loop is defined by a decibel display value of a value obtained by dividing a measured voltage at voltage measurement terminal 202 in FIG. 4 by an input voltage to voltage input terminal 201. As for the phase, a phase of a state in which the measured voltage at voltage measurement terminal 202 is completely opposite in phase to the input voltage to voltage input terminal 201 is defined as 0°. Further, a state in which the phase of the measured voltage at voltage measurement terminal 202 is advanced with respect to the phase of the input voltage to voltage input terminal 201 is defined as "positive phase", and a state in which the phase of the measured voltage is delayed with respect to the phase of the input voltage is defined as "negative phase".

By this definition, in general, feedback control can be executed such that the electromagnetic noise present in connection line m0 becomes 0 by the major feedback loop forming negative feedback when the phase exceeds −180° and falls below 180°.

On the other hand, when the phase is less than −180° or more than 180°, the major feedback loop forms positive feedback. It is generally known that when the gain of the major feedback loop in a frequency band forming positive feedback exceeds 0 (dB), the major feedback loop causes closed-loop oscillation.

Referring to FIG. 6(a), a frequency range of about 25 (kHz) to 20 (MHz) is a negative feedback band corresponding to a phase range of −180° to 180° of characteristic line P-AFa. On the other hand, a frequency range of 25 (kHz) or less and 20 (MHz) or more is a positive feedback band.

From characteristic line G-AFa, in the analysis result before application of the present embodiment, the positive feedback band includes a frequency region where the gain exceeds 0 (dB) in the vicinity of 25 (kHz) as surrounded by a dotted line in the drawing. Therefore, it can be read that the major feedback loop causes closed-loop oscillation in this frequency region. Therefore, in the configuration before application of the present embodiment, it is understood that it is not easy to obtain a high gain at a desired frequency while suppressing the closed-loop oscillation.

With reference to FIG. 6(b), the positive feedback band and the negative feedback band are determined from characteristic line P-AFb similarly to FIG. 6(a).

From characteristic line G-AFb, it can be seen that, in the configuration of the present embodiment, by arranging inverting amplifier circuit 110 (intermediate frequency component addition unit 30 and low-frequency component subtraction unit 50), the gain in the frequency region of 100 (kHz) or less including the gain peak around 25 (kHz) decreases as compared with FIG. 6(a).

In particular, as indicated by a dotted line in the figure, the gain is reduced by about 20 (dB) in the vicinity of 25 (kHz) corresponding to the gain peak in FIG. 6(a), and as a result, the gain peak can be made lower than 0 (dB). As a result, it is understood that the closed-loop oscillation in the major feedback loop is suppressed in the configuration of the present embodiment.

In addition, in characteristic line G-AFb, as compared with characteristic line G-AFa of FIG. 6(a), the gain around 150 kHz is selectively increased by about 5.0 (dB) at the maximum by the effects of intermediate frequency component addition unit 30 and low-frequency component subtraction unit 50. With this, in compensation signal icmp, frequency components around 150 (kHz) corresponding to the intermediate frequency are increased. As a result, the noise reduction effect of the frequency component corresponding to the intermediate frequency can be expected to be enhanced.

Note that the intermediate frequency (around 150 (kHz)) at which the gain is selectively increased can be designed to an arbitrary frequency by adjusting a loop transfer function (frequency characteristic) of the minor feedback loop by constant adjustment of the circuit element as described later. That is, it is also possible to design the noise reduction device to be specialized in a frequency region other than around 150 (kHz).

FIG. 7 is a graph illustrating an analysis result of a loop transfer function of a minor feedback loop of the noise reduction device according to the second embodiment. In FIG. 7, a characteristic line G-LM2 indicates a gain characteristic with respect to the frequency of the minor feedback loop, and a characteristic line P-LM2 indicates a phase characteristic with respect to the frequency of the minor feedback loop.

The gain on the characteristic line related to the minor feedback loop is defined by a decibel display value of a value obtained by dividing a measured voltage at voltage measurement terminal 302 in FIG. 5 by an input voltage to voltage input terminal 301. As for the phase, similarly to the major feedback loop, a phase of a state in which the measured voltage at voltage measurement terminal 302 is completely opposite in phase to the input voltage to voltage input terminal 301 is defined as 0°. Similarly, a state in which the phase of the measured voltage is advanced with respect to the phase of the input voltage is defined as "positive phase", and a state in which the phase of the measured voltage is delayed with respect to the phase of the input voltage is defined as "negative phase".

Generally, when the phase is in the range above −180° and below 180°, the minor feedback loop forms a negative feedback, and feedback control is performed such that compensation signal icmp=0 according to the gain. Therefore, by selectively setting the frequency range in which the phase is −180° to 180°, it is possible to perform feedback control so that the component of an arbitrary frequency band of compensation signal icmp becomes 0.

On the other hand, when the phase is less than −180° or more than 180°, the minor feedback loop forms positive feedback. Therefore, it is generally known that when the gain of the minor feedback loop in a frequency band forming positive feedback exceeds 0 (dB), the minor feedback loop causes closed-loop oscillation.

Although the feedback control in general negative feedback is as described above, the inventor has confirmed that the feedback control is not performed to set the control target to 0 in the vicinity of −180° or the vicinity of 180° even if the phase is within the range of −180° to 180°, and conversely, the feedback control is performed so as to increase the control target, as described later. In the present embodiment, the function of intermediate frequency component addition unit 30 illustrated in FIGS. 1 and 2 is realized by setting the gain and the phase of the intermediate frequency to be a noise reduction target in this manner.

Referring to FIG. 7, in characteristic line P-LM2, a frequency range of 1 (Hz) to 25 (MHz) in which the phase exceeds −180° and falls below 180° becomes a negative feedback band, and a frequency range higher than 25 (MHz) in which the phase falls below −180° becomes a positive feedback band.

From characteristic line G-LM2, since the gain exceeds 0 (dB) particularly in the band (low frequency region) of 1 (Hz) to 100 (kHz) in the negative feedback band, it is understood that the feedback control is performed so that compensation signal icmp becomes 0. This also coincides with the fact that the gain of the major feedback loop decreases in the frequency region of 100 (kHz) or less in characteristic line G-AFb of FIG. 6(b), as compared with characteristic line G-AFa of FIG. 6(a). As described above, by the action of inverting amplifier circuit 110, a negative minor feedback loop is equivalently formed for the low frequency signal with respect to the major feedback loop that generates compensation signal icmp. As a result, the function of low-frequency component subtraction unit 50 in FIGS. 1 and 2 is realized.

In characteristic lines G-LM2 and P-LM2 of FIG. 7, the gain at 150 (kHz) in the minor feedback loop is about −3.9 (dB), and the phase is about −150°. As described above, in characteristic line G-AFb illustrated in FIG. 6(b), the gain around 150 (kHz) is selectively increased and is increased by 5.0 (dB) at the maximum as described above by an influence of bringing the phase at the intermediate frequency (150 (kHz)) close to −180°.

As described above, by the action of inverting amplifier circuit 110, a positive minor feedback loop is equivalently formed for the component of the intermediate frequency with respect to the major feedback loop that generates compensation signal icmp. As a result, the function of intermediate frequency component addition unit 30 is realized, and it can be expected that a high noise reduction effect is exhibited in the frequency region around 150 (kHz). Further, the function of phase inversion element 33 in FIG. 2 is realized by bringing the phase at the intermediate frequency (150 (kHz)) close to −180°.

As described above, in the noise reduction device according to the second embodiment, the reduction of the low-frequency component (in the example of FIG. 6, the frequency region is 100 (kHz) or less.) and the amplification of the intermediate frequency component (in the example of FIG. 6, around 150 (kHz)) are performed by the minor feedback loop by intermediate frequency component addition unit 30 and low-frequency component subtraction unit 50, and the above-described effect can be exhibited.

Note that, in the present embodiment, 100 (kHz) defined as a boundary of the low-frequency components corresponds to the example of a "first frequency", and 150 (kHz) corresponding to an intermediate frequency corresponds to the example of a "second frequency". Furthermore, in the circuit configuration example of FIG. 3, inverting amplifier circuit 110 corresponds to an embodiment of an "inverting amplifier circuit" common to intermediate frequency component addition unit 30 and low-frequency component subtraction unit 50. Furthermore, phase shifter circuit 160 provided in differential inverting amplifier circuit 150 corresponds to an example of a "first phase shifter circuit", and phase shifter circuit 120 provided in inverting amplifier circuit 110 corresponds to an example of a "second phase shifter circuit".

Third Embodiment

In the following embodiment, an example of adjustment of the frequency characteristic of the minor feedback loop will be described. In a third embodiment, adjustment to advance the phase of the minor feedback loop as compared with the second embodiment will be described.

FIG. 8 is a graph illustrating an analysis result of a loop transfer function of a minor feedback loop of the noise reduction device according to the third embodiment.

In the third embodiment, on the basis of the electric circuit of noise reduction device 10x according to the second embodiment illustrated in FIG. 3, the phase of the minor feedback loop is advanced from the characteristics in FIG. 7 by adjusting the circuit element constants constituting phase shifter circuit 160 of differential inverting amplifier circuit 150 in compensation signal generator 60 and phase shifter circuit 120 of inverting amplifier circuit 110 (intermediate frequency component addition unit 30 and low-frequency component subtraction unit 50).

Referring to FIG. 8, a characteristic line G-LM3 indicates a gain characteristic in the third embodiment, and a characteristic line P-LM3 indicates a phase characteristic in the third embodiment. From characteristic lines G-LM3 and P-LM3, in the third embodiment, the gain at 150 (kHz) is −9.8 (dB), and the phase is about −138°.

Therefore, as compared with the second embodiment (FIG. 7) in which the gain of −3.9 (dB) and the phase of −150° at 150 (kHz), it is understood that the gain decreases and the phase is separated from −180° in the third embodiment. As a result, the amplification of the intermediate frequency (here, around 150 (kHz)) by increasing the frequency component whose phase is set to be near −180° described above is hardly performed. Therefore, unlike the second embodiment, the function of intermediate frequency component addition unit 30 is not exhibited.

FIG. 9 is a graph illustrating an analysis result of a loop transfer function of the major feedback loop of the noise reduction device according to the third embodiment.

Similarly to FIG. 6(a), FIG. 9(a) illustrates an analysis result for only the major feedback loop before application of the present embodiment, that is, without intermediate frequency component addition unit 30 and low-frequency component subtraction unit 50. Specifically, in the electric circuit of FIG. 4 in which the circuit constant according to the third embodiment has been adjusted, which has been described with reference to FIG. 8, the analysis result can be obtained by setting a circuit from which inverting amplifier circuit 110 has been removed as an analysis target.

On the other hand, FIG. 9(b) illustrates an analysis result at the time of application of the present embodiment in which the electric circuit of FIG. 4 subjected to the adjustment of the circuit constant according to the third embodiment is to be analyzed.

In FIG. 9(a), a characteristic line G-AF3a indicates a gain characteristic with respect to a frequency, and a characteristic line P-AF3a indicates a phase characteristic with respect to the frequency. Similarly, in FIG. 9(b), a characteristic line G-AF3b indicates a gain characteristic with respect to the frequency of the major feedback loop, and a characteristic line P-AF3b indicates a phase characteristic with respect to the frequency of the major feedback loop.

Also in FIGS. 9(a) and 9(b), a negative feedback band (approximately 25 (kHz) to 20 (MHz)) and a positive feedback band (approximately 25 (kHz) or less, or 20 (MHz) or more) exist in association with the phases at characteristic lines P-AF3a and P-AF3b.

From comparison between characteristic lines G-AF3a and G-AF3b, in the peripheral frequency region centered on 150 (kHz), the gain increases by about 2.2 (dB) at the maximum due to the arrangement of inverting amplifier circuit 110 (intermediate frequency component addition unit 30 and low-frequency component subtraction unit 50). The gain increase is small as compared to the gain increase (about 5.0 (dB) at the maximum) between characteristic lines G-AFa and G-AFb in the second embodiment. That is, the function of intermediate frequency component addition unit 30 is weakened as compared with the second embodiment.

This is related to the difference between the second embodiment and the third embodiment regarding the gain and the phase at 150 (kHz) in the minor feedback loop described above. That is, comparing the phases at 150 (kHz) between the second embodiment and the third embodiment, the phase (−138°) of the third embodiment has a larger margin amount with respect to −180° than the phase (−150°) of the second embodiment. Therefore, it is estimated that the gain at frequencies around 150 (kHz) greatly increased in the second embodiment, whereas the gain increase was suppressed in the third embodiment.

It can be seen from characteristic line G-AF3b in FIG. 9(b) that, also in the third embodiment, as in the second embodiment, the gain in the frequency region of about 100 (kHz) or less including the gain peak around 25 (kHz) is reduced as compared with characteristic line G-AF3a in FIG. 9(a). Therefore, it is understood that the effect of reducing the low-frequency component (for example, a frequency region of 100 (kHz) or less) by low-frequency component subtraction unit 50 of the second embodiment and the third embodiment is equivalent.

As described above, in the noise reduction device according to the third embodiment, it is possible to stabilize the circuit operation by suppressing the oscillation by the gain suppression while maintaining the effect of reducing the low-frequency component by the adjustment of advancing the phase of the minor feedback loop. However, it is understood that the noise reduction effect of the frequency components around the intermediate frequency (150 (kHz)) is higher in the second embodiment.

Fourth Embodiment

In the fourth embodiment, contrary to the third embodiment, adjustment of delaying the phase of the minor feedback loop will be described as compared with the second embodiment.

Also in the fourth embodiment, on the basis of the electric circuit of noise reduction device 10x according to the second embodiment illustrated in FIG. 3, the phase of the minor feedback loop is delayed from the characteristics in FIG. 7 by adjusting the circuit element constants constituting phase shifter circuit 160 (in differential inverting amplifier circuit 150) and phase shifter circuit 120 (in inverting amplifier circuit 110).

Figure 10:
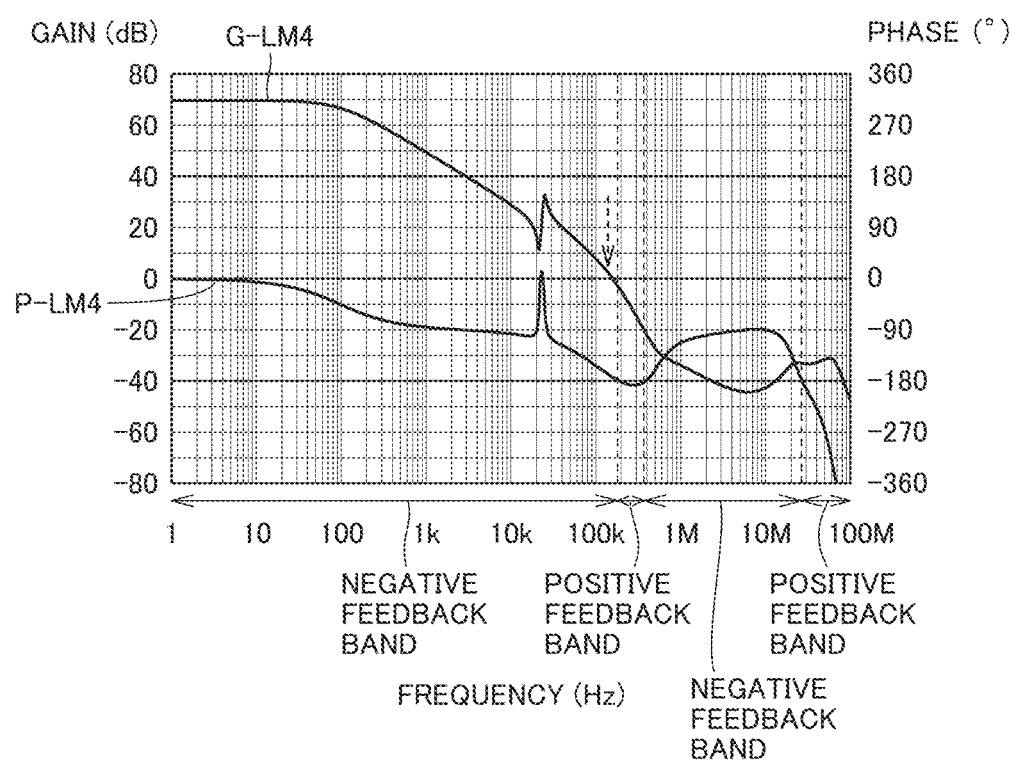
FIG. 10 is a graph illustrating an analysis result of a loop transfer function of a minor feedback loop of the noise reduction device according to a fourth embodiment.

FIG. 10 is a graph illustrating an analysis result of a loop transfer function of a minor feedback loop of the noise reduction device according to the fourth embodiment.

Referring to FIG. 10, a characteristic line G-LM4 indicates the gain characteristic in the fourth embodiment, and a characteristic line P-LM4 indicates the phase characteristic in the fourth embodiment. From characteristic lines G-LM4 and P-LM4, in the fourth embodiment, the gain at 150 (kHz) is 1.0 (dB), and the phase is about −171°. Therefore, as compared with the case where the gain is −3.9 (dB) and the phase is −150° at 150 (kHz) in the second embodiment (FIG. 7), it is understood that the gain increases and the phase approaches −180° in the third embodiment.

In particular, the phase at 150 (kHz) is brought close to −180° by adjusting the phase such that the frequency region of 200 to 400 (kHz) becomes the positive feedback band. Furthermore, the gain is set to be slightly higher than 0 (dB).

As a result, in the fourth embodiment, contrary to the third embodiment, the amplification effect of the frequency components around the intermediate frequency (150 (kHz)) corresponding to the function of intermediate frequency component addition unit 30 is enhanced. In the fourth embodiment, the phase around 150 (kHz) where the gain is set slightly higher than 0 (dB) is close to −180° but not lower than −180°, so that no oscillation occurs.

FIG. 11 is a graph illustrating an analysis result of the loop transfer function of the major feedback loop of the noise reduction device according to the fourth embodiment.

Similarly to FIGS. 6(a) and 9(a), FIG. 11(a) illustrates an analysis result for only the major feedback loop before application of the present embodiment, that is, without intermediate frequency component addition unit 30 and low-frequency component subtraction unit 50. Specifically, in the electric circuit of FIG. 4 in which the circuit constant according to the fourth embodiment has been adjusted, which has been described with reference to FIG. 10, the analysis result can be obtained by setting a circuit from which inverting amplifier circuit 110 has been removed as an analysis target.

On the other hand, FIG. 11(b) illustrates an analysis result for the electric circuit of FIG. 4 subjected to the adjustment of the circuit constant according to the fourth embodiment.

In FIG. 11(a), a characteristic line G-AF4a indicates a gain characteristic with respect to a frequency, and a characteristic line P-AF4a indicates a phase characteristic with respect to the frequency. Similarly, in FIG. 11(b), a characteristic line G-AF4b indicates a gain characteristic with respect to the frequency of the major feedback loop, and a characteristic line P-AF4b indicates a phase characteristic with respect to the frequency of the major feedback loop.

Also in FIGS. 11(a) and 11(b), a negative feedback band (approximately 25 (kHz) or 50 (kHz) to 20 (MHz)) and a positive feedback band (25 (kHz) or less, 50 (kHz) or less, or 20 (MHz) or more) exist in association with the phases at characteristic lines P-AF4a and P-AF4b.

From comparison of characteristic lines G-AF4a and G-AF4b, in the peripheral frequency region centered on 150 (kHz), the gain increases by about 18.2 (dB) at the maximum due to the arrangement of inverting amplifier circuit 110 (intermediate frequency component addition unit 30 and low-frequency component subtraction unit 50). This gain increase is larger than the gain increase (5.0 (dB) at the maximum) between characteristic lines G-AFa and G-AFb in the second embodiment.

This is related to the difference between the second embodiment and the fourth embodiment regarding the gain and the phase at 150 (kHz) in the minor feedback loop described above. That is, as described above, comparing the phases at 150 (kHz), the phase (−171°) of the fourth embodiment has a smaller margin amount with respect to −180° than the phase (−150°) of the second embodiment. Therefore, it is estimated that the gain increasing action at frequencies around 150 (kHz) is enhanced in the fourth embodiment.

It can be seen from characteristic line G-AF4b in FIG. 11(b) that, also in the fourth embodiment, the gain in the frequency region of about 100 (kHz) or less including the gain peak around 25 (kHz) is reduced as compared with characteristic line G-AF4a in FIG. 11(a). Therefore, it is understood that the effect of reducing the low-frequency component (for example, a frequency region of 100 (kHz) or less) by low-frequency component subtraction unit 50 of the second embodiment and the fourth embodiment is equivalent.

As described above, in the noise reduction device according to the fourth embodiment, the noise reduction effect of the frequency component around the intermediate frequency (for example, 150 (kHz)) can be enhanced while maintaining the low-frequency component reduction effect by the adjustment of delaying the phase of the minor feedback loop.

As described in the second to fourth embodiments, the noise reduction device according to the present embodiment can obtain desired characteristics by adjusting the loop transfer function (frequency characteristics) of the minor feedback loop. Specifically, by adjusting a circuit constant in at least one of phase shifter circuits 120 and 160, it is possible to arbitrarily set a frequency region (low frequency) in which the negative minor feedback loop acts and an intermediate frequency in which the positive minor feedback loop acts.

In particular, in the fourth embodiment, a configuration example has been shown in which the noise reduction effect of the intermediate frequency component (for example, 150 (kHz)) can be enhanced while maintaining the low-frequency component reduction effect. Hereinafter, measurement results of an actual machine experiment to which the noise reduction device according to the fourth embodiment is applied will be exemplified.

FIG. 12 is a graph illustrating an actual measurement result of the noise reduction effect by the noise reduction device according to the fourth embodiment.

In an actual machine experiment of FIG. 12, a motor drive circuit obtained by combining a rectifier circuit, an inverter circuit, and a motor (not illustrated) is applied as noise source circuit 11 (FIG. 3). Furthermore, a line impedance stabilization circuit network (LISN: Line Impedance Stabilization Network) was applied as noise leakage circuit 12 (FIG. 3). The actual measurement experiment of the noise reduction effect was performed using the configuration in which the noise reduction device according to the fourth embodiment is connected to noise source circuit 11 and noise leakage circuit 12 as described above.

In FIG. 12, a vertical axis represents the noise terminal voltage (dBµV) measured in the experiment, and a horizontal axis represents the frequency (Hz). Note that the noise terminal voltage was measured by quasi-peak value detection.

A characteristic line CEa indicates a noise terminal voltage measurement result in a case where compensation signal generator 60 (differential inverting amplifier circuit 150 and emitter follower 180), and intermediate frequency component addition unit 30 and low-frequency component subtraction unit 50 (inverting amplifier circuit 110) are stopped.

On the other hand, a characteristic line CEb indicates a noise terminal voltage measurement result during the operation of the noise reduction device according to the fourth embodiment in a case where compensation signal generator 60 (differential inverting amplifier circuit 150 and emitter follower 180), and intermediate frequency component addition unit 30 and low-frequency component subtraction unit 50 (inverting amplifier circuit 110) are operated.

From comparison of characteristic lines CEa and CEb, it is understood that the noise terminal voltage decreases by 20 (dB) at the maximum in the frequency range from 150 (kHz) to 2 (MHz) with the operations of compensation signal generator 60, low-frequency component subtraction unit 50, and intermediate frequency component addition unit 30.

The measurement result of FIG. 12 also corresponds to the loop transfer function (specifically, characteristic line G-AF4b) of the major feedback loop illustrated in FIG. 11(b). In addition, in the frequency band exceeding 2 (MHz)

in which the gain is 0 (dB) or less in characteristic line G-AF4b, it can be seen from comparison between characteristic lines CEa and CEb in FIG. 12 that no significant change (that is, an influence of the operation of the noise reduction device according to the fourth embodiment) occurs in the noise terminal voltage.

FIG. 13 shows an example of an actual measured waveform of compensation signal icmp in the noise reduction device according to the fourth embodiment.

Also in FIG. 13, compensation signal icmp was measured in a configuration in which the noise reduction device according to the fourth embodiment was connected to noise source circuit 11 and noise leakage circuit 12 similar to those connected in FIG. 12. In each of FIGS. 13(a) and 13(b), the horizontal axis is the time axis, and the vertical axis is the current value of compensation signal icmp.

FIG. 13(a) illustrates the waveform of compensation signal icmp when the loop transfer function of the major feedback loop is adjusted so that oscillation does not occur after intermediate frequency component addition unit 30 and low-frequency component subtraction unit 50 are removed, that is, before the application of the present embodiment, similarly to the simulation condition in FIG. 11(a).

On the other hand, FIG. 13(b) illustrates the waveform of compensation signal icmp when intermediate frequency component addition unit 30 and low-frequency component subtraction unit 50 are operated, that is, when the present embodiment is applied, similarly to the simulation condition in FIG. 11(b). The current waveform in FIG. 13(b) corresponds to the actual measurement result under characteristic lines G-AF4b and P-AF4b in FIG. 11(a).

In FIG. 13(a), an offset current Iof from the zero point is generated in compensation signal (current) icmp. The measured value of Iof in the actual machine experiment by the inventor was about −400 (mA). Such an offset current Iof is generated due to application of an offset voltage generated by operational amplifier 170, transistor 181 or 182, or the like to compensation signal injector 80. In particular, in a case where a low-impedance element at a low frequency, such as a current transformer, is used as compensation signal injector 80, it is easily presumed that offset current Iof would take a relatively large value even if an applied offset voltage is minute.

On the other hand, in FIG. 13(b), it can be seen that almost no offset current is generated in compensation signal icmp. This is because the low-frequency offset voltage is compensated by inverting amplifier circuit 110 (intermediate frequency component addition unit 30 and low-frequency component subtraction unit 50). As described above, by reducing the offset, unnecessary power consumption and narrowing of the ranges of the output current and the voltage amplitude of compensation signal generator 60 can be suppressed.

As described above, the effects of the suppression of the offset signal and the noise reduction by the noise reduction device according to the fourth embodiment were also confirmed from the actual machine experiment. As described above, according to the present embodiment, it is possible to realize the noise reduction device of the feedback control method having a high noise reduction effect while suppressing the offset signal and the oscillation with a simple configuration.

Once again, the intermediate frequency of the noise reduction target can be designed to any frequency by adjusting a loop transfer function (frequency characteristic) of the minor feedback loop by constant adjustment of the circuit element.

In the present embodiment (FIG. 3), connection line m0, noise source current input line m1, and leakage noise current output line m2 are taken as two lines, but in application to three-phase alternating current, each of these lines m0 to m2 is three lines. Alternatively, in a case where a noise reduction device is applied to a signal line instead of a power line, each of m0 to m2 may be four or more.

Furthermore, the noise reduction device according to the present embodiments can be connected to an arbitrary portion of the current path between noise source circuit 11 and noise leakage circuit 12. Furthermore, noise source circuit 11 and noise leakage circuit 12 are not particularly limited, and the noise of the frequency component can be reduced as well as the offset signal and the oscillation can be suppressed by adjusting the loop transfer function (frequency characteristic) of the minor feedback loop described above such that the intermediate frequency is appropriately set corresponding to the frequency component of a reduction target.

In the above-described embodiments, the configuration example has been described where each of the phase shifter circuits 120 and 160 is a low-pass filter in which resistance and capacitance are combined. However, a desired frequency can be obtained by further combining adjustment of a gain-bandwidth product of operational amplifier 115, 170 (when differential inverting amplifier circuit 150 or inverting amplifier circuit 110 is configured by a transistor instead of an operational amplifier, the transistor) in addition to adjustment of a circuit constant of the low-pass filter. Alternatively, by optimally selecting the gain-bandwidth product (GB product) of the operational amplifier and/or the transistor, it is also possible to configure phase shifter circuit 120, 160 by omitting the arrangement of the low-pass filter.

The embodiments disclosed herein should be considered to be illustrative in all respects and not restrictive. The scope of the present disclosure is defined by the claims, instead of the descriptions stated above, and it is intended that meanings equivalent to the claims and all modifications within the scope are included.

REFERENCE SIGNS LIST 10, 10x: noise reduction device, 11: noise source circuit, 12: noise leakage circuit, 20: noise detector, 21, 81: current transformer, 21x, 81y, 81z: secondary winding, 21y, 21z, 81x: primary winding, 30: intermediate frequency component addition unit, 32, 32x, 52, 90, 90x: operator, 35: intermediate frequency component extraction circuit, 50: low-frequency component subtraction unit, 55: low-frequency component amplifier circuit, 60: compensation signal generator, 61: input line, 65: amplifier circuit, 70: compensation signal detector, 71: detection resistor, 80: compensation signal injector, 100: common circuit, 110: inverting amplifier circuit, 115, 170: operational amplifier, 120, 160: phase shifter circuit, 121, 161: negative input resistor, 122, 163: feedback resistor, 123, 164: feedback capacitor, 150: differential inverting amplifier circuit, 162: positive input resistor, 180: emitter follower, 181, 182: transistor, 201, 301: voltage input terminal, 202, 302: voltage measurement terminal, 300: open point, LM0: major feedback loop, LN1, LP1: minor feedback loop, icmp: compensation signal, ignd: leakage noise current, m0: connection line, m1: noise source current input line, m2: leakage noise current output line, vcmp: compensation signal detection voltage, vsns: detection voltage (noise detector)

The invention claimed is:

1. A noise reduction device comprising:
   a noise detector to detect electromagnetic noise on a connection line;
   a compensation signal generator to generate a compensation signal for canceling the electromagnetic noise on the basis of a detection signal of the noise detector;
   a compensation signal injector to inject the compensation signal into the connection line;
   a compensation signal detector to detect the compensation signal;
   a low-frequency component subtraction unit to amplify a frequency component in a first frequency region that is lower than a predetermined first frequency in a detection signal detected by the compensation signal detector, and to negatively feed back the amplified frequency component to the compensation signal generator; and
   an intermediate frequency component addition unit to positively feed back a component of a predetermined second frequency that is higher than the first frequency in the detection signal detected by the compensation signal detector to the compensation signal generator, wherein
   the noise detector detects the electromagnetic noise to which the compensation signal is injected by the compensation signal injector on the connection line.

2. The noise reduction device according to claim 1, wherein
   the noise detector includes a current transformer or a capacitor, and
   the compensation signal injector includes a current transformer.

3. The noise reduction device according to claim 1, wherein
   the noise detector includes a current transformer or a capacitor,
   the compensation signal generator is configured to perform reversed-phase conversion to a signal obtained by amplifying an input signal based on the detection signal of the noise detector, and to output the compensation signal, and
   the compensation signal injector includes a current transformer or a capacitor.

4. The noise reduction device according to claim 1, wherein
   the low-frequency component subtraction unit is configured to feed back a signal obtained by amplifying a frequency component of the first frequency region of the detection signal in the compensation signal detector to an input of the compensation signal generator after reversed-phase conversion, and
   the intermediate frequency component addition unit is configured to perform reversed-phase conversion and then phase inversion to a signal obtained by extracting a component of the second frequency in the detection signal of the compensation signal detector, and then to feed back the signal to which the reverse-phase conversion and the phase inversion are performed, to an input of the compensation signal generator.

5. The noise reduction device according to claim 1, wherein
   the compensation signal generator includes
   a differential inverting amplifier circuit to output the compensation signal, and
   a first phase shifter circuit to adjust a phase difference between an input and an output of the differential inverting amplifier circuit,
   the low-frequency component subtraction unit and the intermediate frequency component addition unit include
   a common inverting amplifier circuit to receive the detection signal of the compensation signal detector as an input, and to generate an output signal that is input to the differential inverting amplifier circuit, and
   a second phase shifter circuit to adjust a phase difference between an input and an output of the common inverting amplifier circuit,
   the differential inverting amplifier circuit is configured to amplify a voltage difference between an output signal of the common inverting amplifier circuit and a detection signal of the noise detector to generate the compensation signal, and
   a gain characteristic of a loop transfer function of a first feedback loop by the compensation signal generator, the compensation signal injector, and the noise detector in a state where a connection between an input of the differential inverting amplifier circuit and the noise detector is opened are adjusted by at least one of the first and second phase shifter circuits such that a gain in the first frequency region decreases and a gain of the second frequency increases, as compared with a case where the low-frequency component subtraction unit and the intermediate frequency component addition unit are not included in the noise reduction device.

6. The noise reduction device according to claim 5, wherein the gain characteristic of the loop transfer function of the first feedback loop is adjusted such that a gain peak in a positive feedback band falls below 0 decibel.

7. The noise reduction device according to claim 5, wherein each of the first and second phase shifter circuits includes at least one of a low-pass filter as a combination of a resistive element and a capacitive element, and a gain-bandwidth product of an operational amplifier or a transistor that constitutes the differential inverting amplifier circuit or the common inverting amplifier circuit.

* * * * *